(12) United States Patent
Lu et al.

(10) Patent No.: US 6,550,045 B1
(45) Date of Patent: Apr. 15, 2003

(54) CHANGING CLOCK DELAYS IN AN INTEGRATED CIRCUIT FOR SKEW OPTIMIZATION

(75) Inventors: Aiguo Lu, Cupertino, CA (US); Ivan Pavisic, San Jose, CA (US); Andrej A. Zolotykj, Moskovskaya Oblast (RU); Elyar E. Gasanov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/991,574

(22) Filed: Nov. 20, 2001

(51) Int. Cl.[7] ................................................ G06F 17/50
(52) U.S. Cl. ........................ 716/6; 716/1; 716/2; 716/4; 716/10
(58) Field of Search ........................................ 716/1–21

(56) References Cited

U.S. PATENT DOCUMENTS

| | | | |
|---|---|---|---|
| 5,740,067 A | * 4/1998 | Hathaway | 716/6 |
| 5,849,610 A | * 12/1998 | Zhu | 438/129 |
| 5,980,092 A | * 11/1999 | Merryman et al. | 716/6 |
| 6,014,510 A | * 1/2000 | Burks et al. | 703/19 |
| 6,205,572 B1 | * 3/2001 | Dupenloup | 716/5 |
| 6,292,931 B1 | * 9/2001 | Dupenloup | 716/18 |
| 6,367,060 B1 | * 4/2002 | Cheng et al. | 716/10 |
| 6,425,114 B1 | * 7/2002 | Chan et al. | 716/6 |
| 6,442,737 B1 | * 8/2002 | Tetelbaum et al. | 716/5 |
| 6,473,890 B1 | * 10/2002 | Yasui et al. | 716/10 |
| 6,480,994 B1 | * 11/2002 | Tetelbaum et al. | 716/10 |
| 2001/0010092 A1 | * 7/2001 | Kato | 716/10 |
| 2001/0021992 A1 | * 9/2001 | Yamashita | 716/8 |

OTHER PUBLICATIONS

I.S.Kourtev et al, Synthesis of clock tree topologies to implement nonzero clock skew schedule, IEE Proc.–Circuits Devices Syst., vol. 146, No. 6, Dec. 1999 pp 321–326.*

M.C. Chi et al, A reliable clock tree design methodology for ASIC designs, ISQED 2000, Proceedings 2000, pp269–274.*

* cited by examiner

*Primary Examiner*—Vuthe Siek
*Assistant Examiner*—Magid Dimyan
(74) *Attorney, Agent, or Firm*—Westman, Champlin & Kelly

(57) ABSTRACT

Clock delays are changed in a clock network of an ASIC. Global skew optimization is achieved by restructuring a clock domain to balance clock delays in the domain, and by equalizing clock delays of several domains of a group that have timing paths between them. Clock delays are equalized using buffer chains affecting all leaves of the respective domain, and an additional delay coefficient that equalizes clock delay. The clock insertion delays are changed for each group by restructuring the buffers in the group, based on both the data and clock logics to optimize the paths. Local skew optimization is achieved by restructuring the clock domain using a heuristic algorithm and re-ordering the buffers of the domain. A computer program enables a processor to carry out the processes.

16 Claims, 4 Drawing Sheets

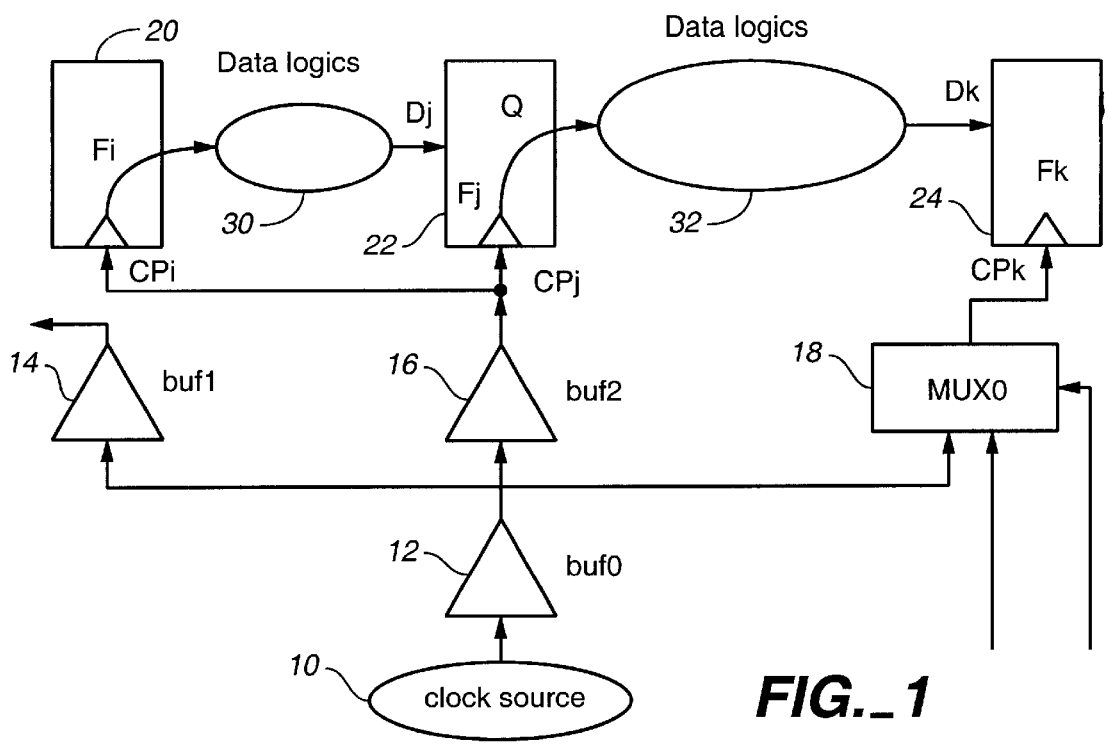
FIG._1
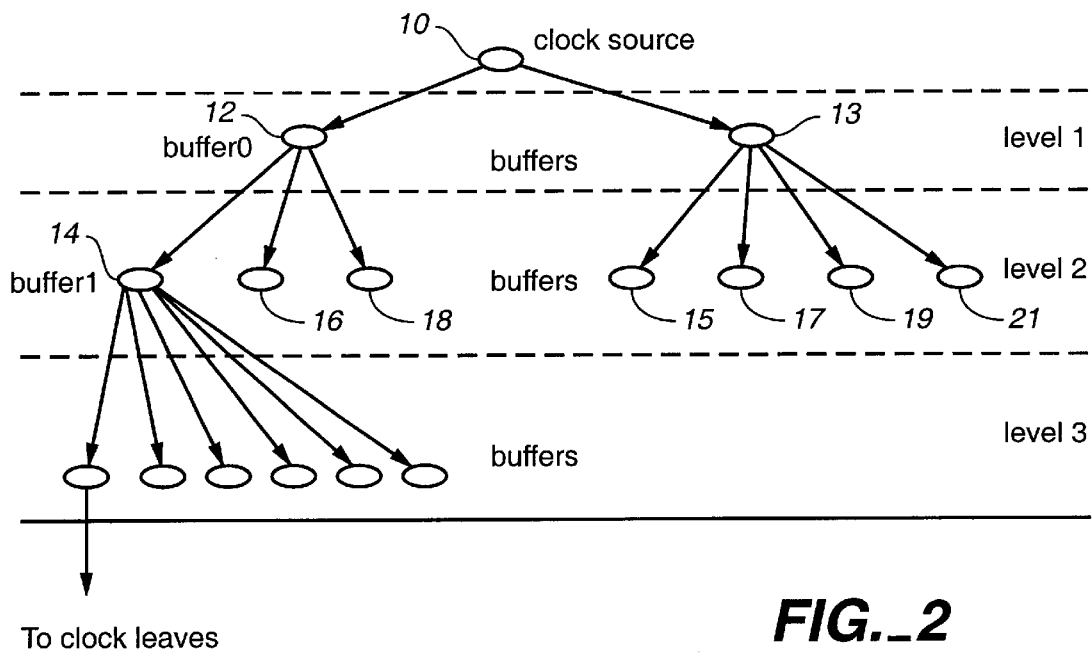
FIG._2

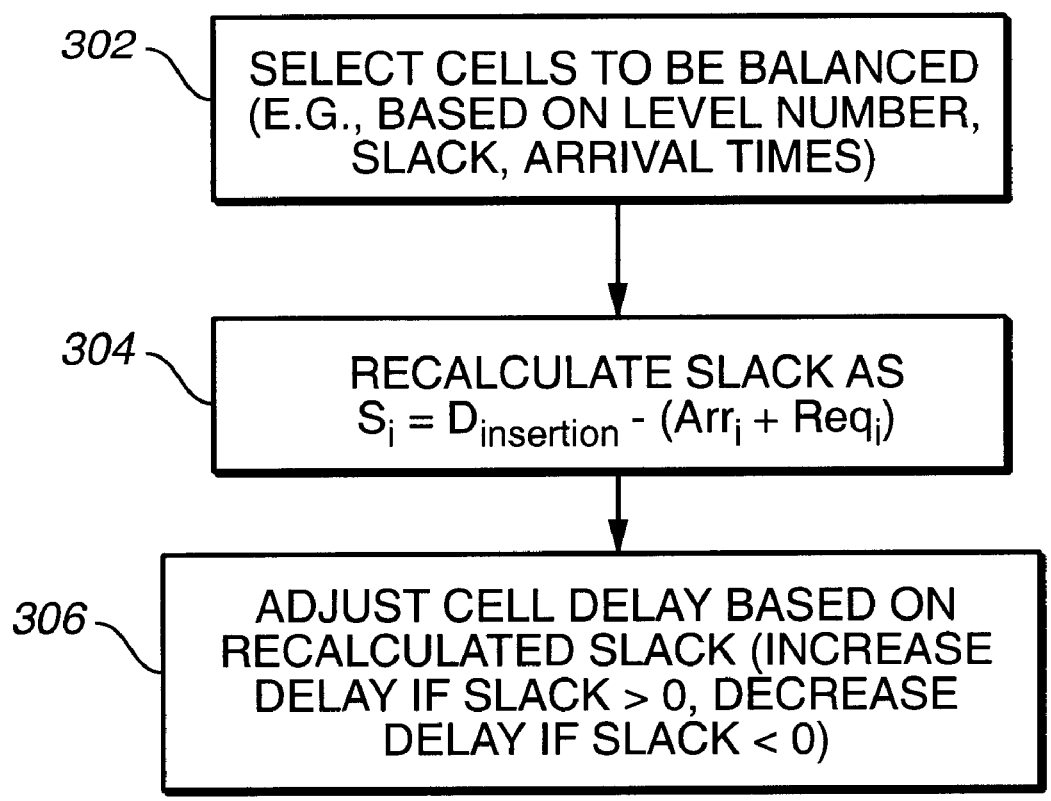
FIG._3

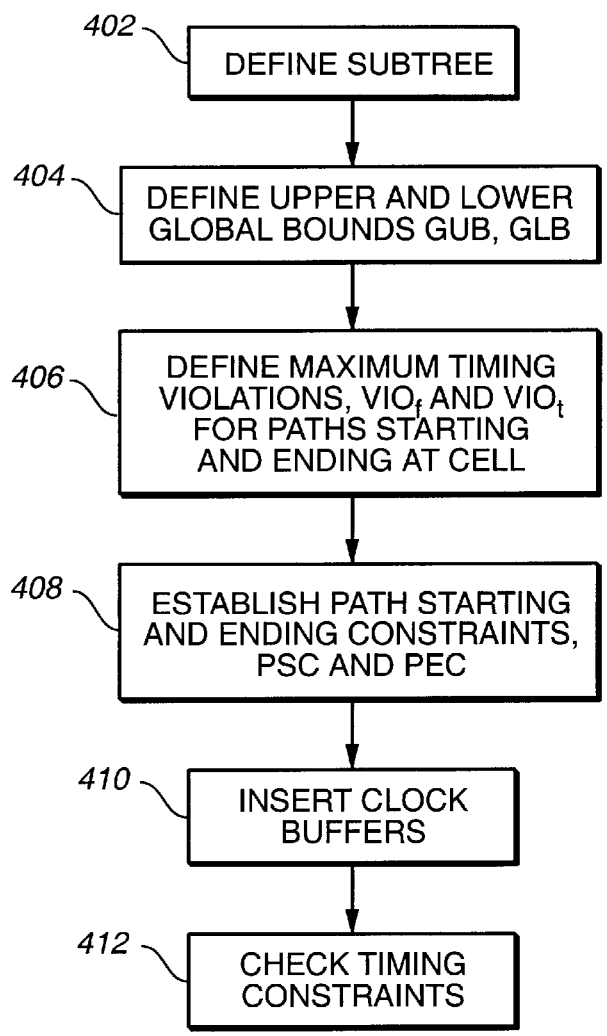
FIG._4
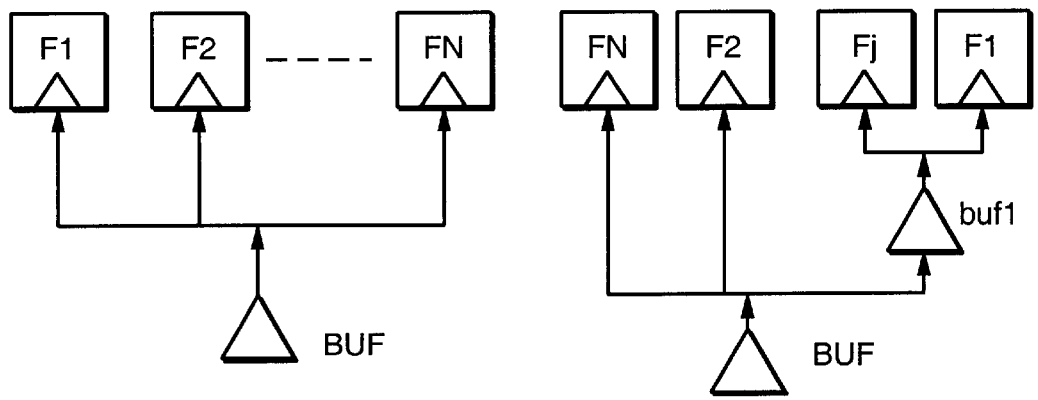
FIG._5A   FIG._5B

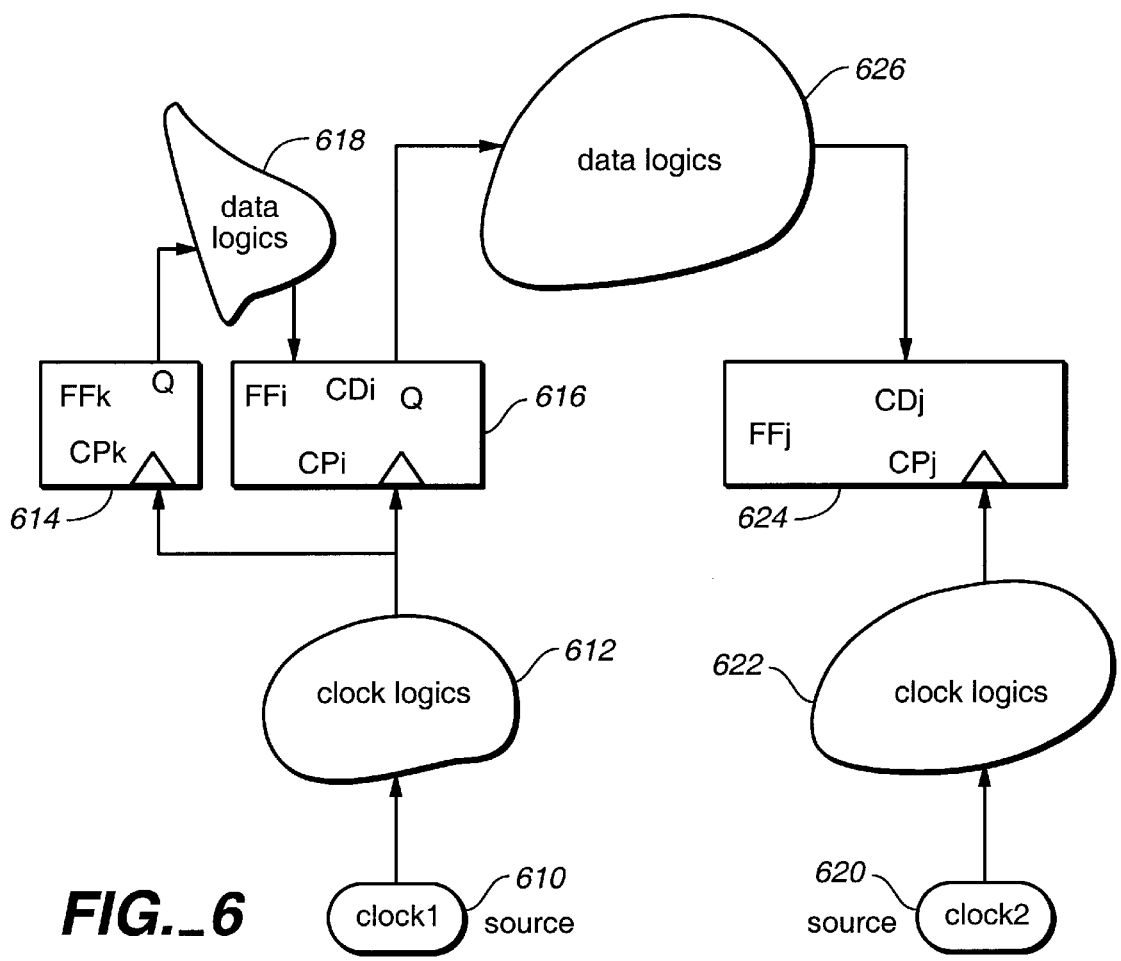
FIG._6
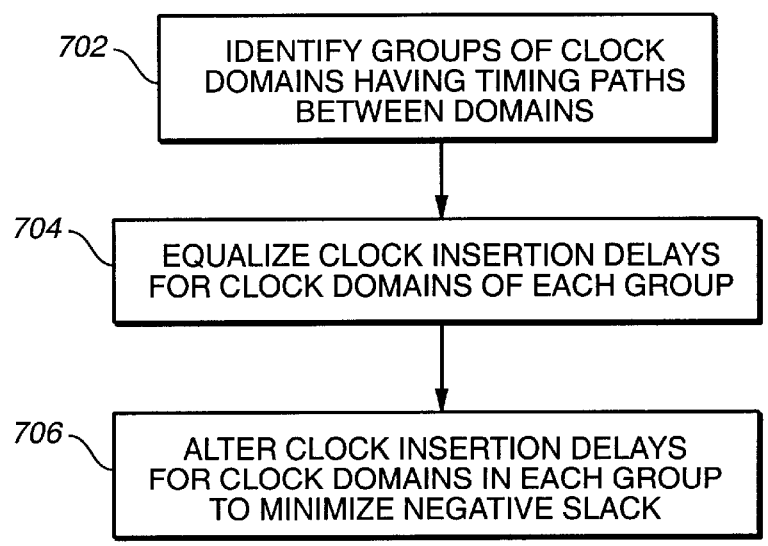
FIG._7

CHANGING CLOCK DELAYS IN AN INTEGRATED CIRCUIT FOR SKEW OPTIMIZATION

FIELD OF THE INVENTION

This invention relates to designing integrated circuit (IC) chips, and particularly to changing clock delays within a clock net of a complex application specific integrated circuit (ASIC). Most particularly, the invention is directed to changing the clock delay within a clock net for skew optimization, and to changing and budgeting clock delays between several clock nets of an ASIC to achieve optimal global clock delay and skew.

BACKGROUND OF THE INVENTION

Problems associated with timing closure of clock nets in ASICs increase with the complexity of ASIC designs and the need for higher operating frequencies of ASIC chips. Presently, timing closure is resolved using clock optimization techniques that address the clock logics separately from the data logics. While the clock optimization problem might be simplified by separating clock logics and data logics in synthesis, this technique also reduces the optimization potential by dividing a single two-dimensional optimization problem into two one-dimensional problems.

The data logics affect timing closure in clock logics. Consequently, the one-dimensional problem solution addressing only the clock logics did not always lead to optimal clock balance between different clock nets. As a result, new optimization techniques are needed to implement the designs more efficiently.

SUMMARY OF THE INVENTION

To achieve better timing results, the present invention provides an integrated approach whereby the clock logics are synthesized and optimized simultaneously with the data logics. The clock logics are restructured based on the timing information of the data logics so that the clock delays (or useful skews) can be used to fix timing violations.

In one embodiment, clock delays are balanced for optimization of clock skew in a clock net of an ASIC by restructuring part of the net. The clock net has at least one clock source. Clock cells to be balanced are selected and a slack is calculated for each selected clock cell based on an insertion delay associated with the clock source and the clock arrival and transition times required by the selected clock cell. The cell delay is adjusted based on the calculated slack.

In other embodiments, groups of clock domains having timing paths between them are identified. Clock insertion delays are equalized for all clock domains of the group. Preferably, clock insertion delay equalization is performed using buffers and an additional delay coefficient. The clock insertion delays are changed by restructuring the buffers to optimize paths between different clock domains.

In other embodiments, clock pins having timing violations are identified based on both clock delay and data delay. The clock net is restructured to optimize timing in the domain.

In one embodiment, the invention is manifest as a computer readable program containing code that, when executed by a processor, causes the processor to balance clock delays to optimize skew in the clock network of an ASIC. More particularly, a storage medium contains processor executable instructions that enable the processor to perform the processes of the invention and alter the clock network to adjusting the cell delay.

BRIEF DESCRIPTION OF THE DRAWINGS

FIG. 1 is diagram of a portion of an ASIC design useful in explaining certain aspects of the present invention.

FIG. 2 is a diagram of a buffer tree useful in explaining certain aspects of the present invention.

FIG. 3 is a flowchart of a process of changing cell delays in accordance with an embodiment of the present invention.

FIG. 4 is a flowchart of a process of buffer insertion useful in the process shown in FIG. 3.

FIGS. 5A and 5B are diagrams of a portion of an ASIC design useful in explaining the buffer insertion process of FIG. 4.

FIG. 6 is a diagram of a portion of an ASIC design useful in explaining other aspects of the invention.

FIG. 7 is a flowchart of a process of reducing slack among clock domains in accordance with another embodiment of the invention.

DETAILED DESCRIPTION OF THE PREFERRED EMBODIMENTS

FIG. 1 illustrates a portion of an ASIC design and is useful to explain part of the clock optimization techniques of the present invention. The ASIC design of FIG. 1 includes a clock source 10 that drives clock logic devices 12, 14, 16 and 18. For example, clock logic devices 12–18 may include clock buffers, identified as bufO, buf1 and buf2, as well as multiplexers, identified as MUXO. The clock logic starts with clock source 10 and ends at sequential cells 20, 22 and 24. Cells 20–24 may, for example, be flip-flops, memories and the like that have clock inputs at $CP_i$, $CP_j$, $CP_k$, etc. that are clock ending points (or clock leaves) of the clock logic. Data logic circuits 30 and 32 are coupled between sequential cells to transfer data between the sequential cells. The data logic paths provide timing information that can affect the clock network timing. Although FIG. 1 shows an ASIC having a four clock logic devices 12–18 coupled to three sequential devices, in practice the ASIC will contain many thousands of sequential devices coupled through several levels of clock logic devices to a single clock source. Moreover, several clock sources may be included on the ASIC, each driving thousands of sequential devices through respective clock logic devices. Each clock source and its respective clock logic devices is herein referred to as a clock domain.

The clock delay at each clock ending point is defined as the delay from clock source 10 to the respective ending point $CP_i$, $CP_j$, $CP_k$. The clock delay is represented by $D_i$, $i \in \{0 \ldots N\}$, where N is the number of ending points from clock source 10. The clock insertion delay, $D_{insertion}$, for each clock domain is the average of clock delays of the domain, represented by $$D_{insertion} = \sum_{i=0}^{N-1} D_i / N.$$

If there are C clock domains in one design, each clock insertion delay is represented by $D|_{insertion}^i$, $i \in \{1 \ldots C\}$. Each clock domain usually consists of one or more high fanout nets and a set of gated logics. The high fanout net can drive many sequential cells (over 100,000 such cells in some designs).

FIG. 2 illustrates the general structure of a buffer tree of a high fanout net. One such buffer tree is described in application Ser. No. 09/820,059 filed Mar. 28, 2001 by Lu et al. for "Distribution Dependent Clustering in Buffer Insertion of High Fanout Nets" and assigned to the same assignee as the present invention. The Lu et al. buffer tree is constructed using a placement-based buffer insertion algorithm.

As shown in FIG. 2, several levels of buffers may be required for the high fanout clock net, each buffer provides a prescribed time delay for clock signals. Thus, with clock source 10 at level 0, buffers 12 and 13 are at level 1 and are connected to source 10, buffers 14–19 and 21 are at level 2 with buffers 14, 16 and 18 connected to buffer 12 and buffers 15, 17, 19 and 21 connected to buffer 13. Changes to the buffer tree at lower levels closest to source 10 (e.g., level 1) will affect numerous clock leaves. Each clock leaf may have different timing constraints from other clock leaves of the net. The different timing constraints of the several clock leaves makes it improbable that a change in the buffer tree will be useful to reduce any timing violation. Consequently, it is difficult to optimize skew in the buffer tree.

In one embodiment of the invention, clock delays are balanced in the lower buffer levels of the clock network. The number of buffer levels that are delay-balanced is based on the slack and the total level count.

The maximal delay $D_{max}$ from clock source 10 to leaves CP (FIG. 1) is the maximal time required to propagate a clock signal from source 10 to any leaf. The arrival time $Arr_i$ at the input pin of a buffer i is the maximal time required to propagate a clock signal from clock source 10 to this pin. The required time $Req_i$ that is necessary for the clock signal to transition through buffer i to all fanout leaves of buffer i. The slack $S_i$ at the input pin is the difference between the maximum delay and the time required to propagate a clock signal and transition buffer i: $S_i=D_{max}-(Arr_i+Req_i)$. Because buffers 12, 14 and 16 in FIG. 1 have one input and one output, the slack at the output pin is the same as the slack at the input pin. Hence, in FIG. 1, the slack at pin $CP_i$ is $S_i=D_{max}-(Arr_i+Req_i)$ FIG. 3 is a flowchart of a process of delay balancing cells, including buffers and gated logic elements, in accordance with one embodiment of the present invention. At step 302, the cells to be balanced are selected. For the purposes of this embodiment, cells in half of the levels closest to the clock source will be considered for delay balancing. Thus, those cells located in levels 1 through level L/2 (or (L+1)/2 if L is an odd number) are considered as candidates for delay balancing, where L is the total number of levels of the clock network (both gated logics and buffered high fanout nets). Each candidate cell is selected based on its level. If either of the following two conditions are satisfied, the cell will be considered for delay-balancing:

(1) $|S_i| \geq T/8$, where $S_i$ is the slack at the cell output pin.
(2) $Max_{arr}-Min_{min} \geq T/8$, where $Max_{arr}-Min_{min}$ is an arrival window between the maximal arrival time $Max_{arr}$ and the minimal arrival time $Min_{min}$ of all input pins driven by the cell.

It is evident that the criteria for selecting a cell as a candidate for delay balancing is empirically derived. Consequently, cells in any number or portion of levels may be considered for delay balancing. Additionally, the minimal limit for the slack and/or the arrival window may be selected using other convenient criteria, although a fraction(s) of the clock cycle is quite convenient. Hence, a cell is selected if it is within some range of levels from the clock source and either the slack at the cell output is greater than some time period or the arrival window for all pins of the cell is greater than some time period.

At step 304, the slack on each pin of the selected cells is recalculated as $S_{Ri}=D_{insertion}-(Arr_i+Req_i)$. At step 306, the delay is adjusted based on the value of the recalculated slack $S_{Ri}$. More particularly, if the recalculated slack of a cell i is greater than zero ($S_{Ri}>0$), the cell delay is increased. If the recalculated slack of a cell i is smaller than zero ($S_{Ri}<0$), the cell delay is decreased. Consequently, the delays are balanced within the clock domain. Moreover, the above described delay balancing serves as a good starting point for skew optimization for groups of clock domains having paths, such as data logic circuits, between individual clock domains of the group.

Adjustment of the cell delay is performed by cell resizing techniques and by buffer insertion. Buffer insertion in a clock path will change the delay in the path to thereby achieve cell delay adjustment. However, changing the delay will affect skew values of the affected clock leaves. Thus in FIG. 1, the slack from pin $CP_j$ to data pin $D_k$ of sequential device 22 is $S_{jk}=T-SK_j-D_{jk}-C_k+SK_k$, where T is the clock cycle, $SK_j$ and $SK_k$ are the skews at pins $CP_j$ and $CP_k$, respectively, $D_{jk}$ is the worst case delay along data logics path 32 between pins $CP_j$ and $D_k$, and $C_k$ is the sum of the setup time (which is based technology and cell type) and a user-defined clock uncertainty. The skew SK at a pin is the delay from the clock source to the pin minus the clock insertion delay. If $S_{jk}$ is negative (i.e., if $SK_j+D_{jk}+C_k>T+SK_k$), there is a timing violation at pin $D_k$. If (in the example of FIG. 1) the slack $S_{jk}$ along the data logics path from pin $CP_j$ to data pin $D_k$ is negative (indicating a timing violation), then a reduction of $SK_j$ will improve the performance of the path, possibly making the slack positive to remove the timing violation (e.g., $SK_j+D_{jk}+C_k<T+SK_k$). However, reducing $SK_j$ may adversely affect slack along another path. Thus in FIG. 1, the slack from pin $CP_i$ to pin $D_j$ is $S_{ij}=T-SK_i-D_{ij}-C_k+SK_j$. Reduction of $SK_j$ to improve performance of the path from pin $CP_j$ to $D_k$ will worsen the performance of the path from pin $CP_i$ to pin $D_j$.

FIG. 4 is a flowchart of the process of inserting buffers to adjust delays in the subtree. The process of FIG. 4 identifies clock pins having timing violations (considering delays of both the clock and data paths) and restructures the clock net to optimize timing. At step 402, a subtree is defined having a leaf with a violated clock pin. At step 404, upper and lower global bounds GUB and GLB are defined to set bounds of the skew value allowed:

$$GUB = \text{Min}\left(\frac{T}{2}, T - D_{insertion}\right) - \alpha, \text{ and}$$

$$GLB = -\text{Min}\left(\frac{T}{2}, T - D_{insertion}\right) + \alpha,$$

where α is a constant that depends on implementation technology to avoid signal competition and Min is the operation to obtain minimum value. At step 406, maximal timing violations are calculated for all paths starting with a sequential cell and for all paths ending with the sequential cell. If a sequential cell j (such as a flip-flop) has only one pin connected to the clock net, the initial skew at that pin is $SK_j$. The input pin that is connected to the clock domain is selected as the starting point of the delay paths. The maximal timing violation for all paths starting from cell j is $Vio_{fj}$ and the maximal timing violation for all paths ending at cell j is $Vio_{tj}$. If path j→k is the worst case of all paths starting from cell j, $Vio_{fj}=-S_{jk}$; if path i→j is the worst case of all paths ending at cell j, $Vio_{tj}=-S_{ij}$.

At step 408, path starting and ending constraints are established. The path starting constraint PSC and path ending constraint PEC for cell j, are:

$PSC_j=Min(SK_j-GLB, TS)$, if $TS \geq 0$, or $PSC_j=-Min(GUB-SK_j, -TS)$, if $TS<0$, and $PEC_j=Min(SK_j-GLB, TE)$, if $TE \geq 0$, or $PEC_j=Min(GUB-SK_j, -TE)$, if $TE<0$, where $TS=Vio_{fj}$ and $TE=-Vio_{ij}$ if $Vio_{fj}<0$ && $Vio_{ij}<0$ or $TS=TE=(Vio_{fj}-Vio_{ij})/2$ for all other conditions.

If a subtree contains a single level, having N leaves whose path constraints PSC and PEC have been calculated in step 408 as $PSC_i$ and $PEC_i$ ($i \subseteq \{1, 2, \ldots, N\}$), the delay from the clock root to leaf i should be reduced by reducing skew $SK_i$ if $PSC_i>0$ and $PEC_i>0$, with the upper limit of the delay reduction being $PEC_i$. Similarly, the delay from the clock root to leaf i should be increased if $PEC_i<0$ and $PSC_i<0$, with the upper limit of the delay increase being $|PSC_i|$. A heuristic procedure or algorithm for this is (1) The original subtree leaves (OriN) are ordered based on $PSC_i$ ($i \subseteq \{1, 2, \ldots, N\}$) in decreasing order. The leaf with the maximal PSC is ordered first and the leaf with the minimal PSC is ordered last. This results in a new leaf set MidN.

(2) From the ordered MidN leaves, find leaf j that satisfies $PSC_j<0$.

(3) for leaves $i \subseteq \{j, j+1, \ldots, N\}$ in MidN, order the leaves based on $PEC_i$ in decreasing order, resulting in leaf set TmpN.

(4) Form final ordered leaves OrdN in which $$OrdN|_{i \subseteq \{1, 2, \ldots, N\}} = MidN|_{i \subseteq \{1, 2, \ldots, j-1\}}, TmpN|_{i \subseteq \{j, \ldots N\}}.$$

At step 410, clock buffers are inserted into the tree identified at step 402. This is accomplished by ordering the leaves of the subtree and inserting buffers to drive one or more of the ordered leaves. FIGS. 5A and 5B set forth an example in which $F_N$ becomes the first leaf, $F_2$ becomes the second leaf and $F_1$ is ordered to the last leaf. After all leaves are ordered, a new buffer $buf_1$ is inserted at step 410 (FIG. 4) to drive one or more leaves in OrdN. Thus, as shown in FIG. 5B, new buffer $buf_1$ drives leaves $F_j$ and $F_1$.

After new buffer $buf_1$ is inserted, the timing constraints are checked at step 412. If the timing constraints are met, the skew value and timing information are updated for all paths starting or ending at the leaves. If the timing constraints cannot be met, and if all violated clock pins have been tried, the process ends.

Most ASICs, such as system-on-chip ASICs, employ more than one clock domain. Where several clock domains are coupled together, such as by data logics, the clock domains should be synchronized for optimal timing. Clock insertion delay is used as the reference point to calculate delays from one clock domain to another clock domain.

FIG. 6 illustrates a portion of an ASIC having data timing paths between two clock domains. More particularly, clock source 610 supplies clock1 signals to clock logic devices 612, which in turn supplies clock signals to the clock input pins $CP_i$ and $CP_k$ of sequential elements 614 and 616. Data logic circuits 618 provide timing paths between elements 614 and 616. A clock insertion delay $D|_{insertion}^{clock1}$ exists for the clock network, or domain, that starts from source 610 and ends at pins $CP_i$ and $CP_k$. Thus, the clock domain starting from clock source 610 is similar to the clock domain illustrated in FIG. 1. A second clock source 620 supplies clock2 signals to clock logic devices 622, which in turn supplies clock signals to the clock input pins $CP_j$ of sequential element 624. Thus a second clock domain, also similar to the clock domain illustrated in FIG. 1, starts from source 620 and ends at pins $CP_j$. The second clock domain has clock insertion delay $D|_{insertion}^{clock2}$ that may be different from $D|_{insertion}^{clock1}$.

As shown in FIG. 6, data logic circuits 626 provide a timing path between elements 616 and 624 of the two clock domains. The clock skew at a clock pin is the delay from clock source to the pin, less the clock's insertion delay. The skew at the clock pin $CP_i$ is $SK_i$, and the skew at the clock pin $CP_j$ is $SK_j$. $D_{datamax}$ is the maximal path delay along the data logic path from input pin $CP_i$ of cell $FF_i$ to data pin $CD_j$ of cell $FF_j$. Consequently, the maximal path delay, $D_{ij}$, representing both the clock path and the data path from $FF_i$ to $FF_j$ is $D_{ij}=C_k+D|_{insertion}^{clock1}+SK_i+D_{datamax}-D|_{insertion}^{clock2}-SK_j$.

The above delay calculation demonstrates that clock insertion delays and data paths are factors which should be taken into account to adjust skew between clock domains. Because clock insertion delays are used as the reference values to calculate the skews, they should not be changed when optimizing skew. However, at this point, global timing budget can be achieved for the paths between different clock domains if the clock networks are restructured properly.

It should be noted that changing the clock insertion delay will not change the path delays within the same clock domain. For example, in FIG. 6 the path delay from input pin $CP_k$ in cell $FF_k$ to data pin $CD_i$ in cell $FF_i$ will be the same regardless of the value of $D|_{insertion}^{clock1}$. This is because any change to $D|_{insertion}^{clock1}$ will have the same effect on both skews $SK_k$ and $SK_i$.

The required time $R_{ij}$ for the path between $FF_i$ and $FF_j$ can be obtained from an analysis of the waveform of clock1 and clock2. Therefore, the slack at data pin $CD_j$, denoted as $S_{ij}$, is $R_{ij}-D_{ij}$. If $S_{ij}$ is negative, there is a timing violation at data pin $CD_j$ (data input pin). The goal of all timing optimization techniques is to eliminate negative slacks at each data input pin. The total negative slack of a design is the sum of the negative slacks at each data input pin. Therefore, if the total negative slack is 0, there will be no timing violation in the design.

If the value of $D|_{insertion}^{clock1}$ can be reduced, $D_{ij}$ is also reduced, making $S_{ij}$ positive (or reducing the total negative slack). FIG. 7 is a flowchart of the process to accomplish reduction of slack. At step 702, the group(s) of clocks are identified where there are real timing paths among the clocks of the group. Based on the timing path analysis (also including any user-specified false paths), timing paths between two clock domains can be identified. If there are N clocks in a design, an array CN[N] represents the dependency between clocks. If CN[i] equals −1, clock i does not have any path from its clock domain to any other clock domain. Therefore, CN[i]=−1 means that clock i is an independent clock. If CN[j]=CN[k] and CN[k]≠−1, real timing paths exist between clock domain j and clock domain k. For example, if a design has ten clocks, designated clock0 through clock9, and the path analysis gives CN=[1,0,0,0,0,1,2,2,1,−1] clock9 is an independent clock because CN[9]=−1. Since CN[0]=CN[5]=CN[8]=1, clock0, clock5 and clock8 belong to the same group. Similarly, clock1, clock2, clock3 and clock4 belong to one group, and clock6 and clock7 belong to one group. Therefore, there are three clock groups: a first group composed of clock0, clock5 and clock8, a second group composed of clock1, clock2, clock3 and clock4, and a third group composed of clock6 and clock7. Clock9 is an independent clock.

At step 704, the clock insertion delay is equalized for all clocks belonging to each respective clock group. To simplify the description (without losing the generality), a group composed of clock0, clock5 and clock8 have insertion delays $D|_{insertion}^{clock0}$, $D|_{insertion}^{clock5}$ and $D|_{insertion}^{clock8}$, respectively. $MaxD_{insertion}$ is the maximal value among these insertion delays. Clock insertion delays are equalized among the clock domains of the group by inserting delay, such as in the form of a chain of inserted buffer cells, at each clock source so that the clock insertion delay for each clock of the group equals $MaxD_{insertion}$+Coef, where Coef is an additional value. The additional value, Coef, may be different for each domain, depending on the domain's insertion delay. Thus, $D|_{insertion}^{clock0}+Coef_0=D|_{insertion}^{clock5}+Coef_5=D|_{insertion}^{clock8}+Coef_8=MaxD_{insertion}+Coef$. To ensure that changing the clock insertion delay gives the same effect on all leaves of the clock, a chain of buffers is built from the clock source.

At step 706, the insertion delays are changed for each clock group to minimize the total negative slacks. Because changing a given clock insertion delay only affects paths between the affected clock and other clocks in the group, the slacks for only the related data input pins need to be updated. Because, after step 706, each clock source drives a chain of cells, removing buffers from or inserting buffers into this chain will only affect the clock's insertion delay, but will not affect the skews at the leaves of this clock. Therefore, only the clock insertion delay is used for global timing budget for the paths between clock domains. As a result, calculation is greatly simplified.

The present invention thus provides for the changing of clock delays and optimization of clock skew in a clock network of an ASIC. The processes of FIGS. 3 and 7 balance clock delays for global skew optimization in the ASIC. Thus, in FIG. 3, clock cells to be balanced are selected as a subtree of a clock tree and the subtree is restructured to optimize skew within the subtree. More particularly, a slack is calculated for each selected clock cell based on an insertion delay associated with the clock source and the clock arrival and transition times required by the selected clock cell. The cell delay is adjusted based on the calculated slack.

In FIG. 7, the clock network includes a plurality of clock sources each defining a clock domain, and the ASIC further includes data circuits that define timing paths between at least two clock domains. At least one group of clock domains having timing paths between member domains is identified and the clock insertion delays are equalized for all clock domains of the group. The clock insertion delays are equalized using a chain of buffers with an additional delay coefficient for each clock. The clock insertion delays are then changed by restructuring the buffer chain to thereby optimize clock paths.

The process of FIG. 4 changes clock delays to optimize skew at a local level. In this case, timing violations are found based on both the clock and data delays and the subtree is restructured to optimize timing based on a heuristic process and ordering of the leaves.

In one form, the invention is carried out through use of a processor programmed to carry out the processes. A computer readable program code is stored in a computer readable storage medium, such as a disc drive, and contains instructions that enable the processor to carry out the steps of the processes of changing clock delays and optimization of clock skew in a clock network of an ASIC. More particularly, the instructions enable the processor to balance clock delays for global skew optimization in the ASIC, including between clock domains of a group of domains having timing paths between them. Other instructions enable the processor to change clock delays to optimize skew at a local level. In this case, the instructions enable the processor to locate timing violations based on both clock and data delays and to restructure the subtree to optimize timing based on a heuristic algorithm to re-order the leaves.

Although the present invention has been described with reference to preferred embodiments, workers skilled in the art will recognize that changes may be made in form and detail without departing from the spirit and scope of the invention.

What is claimed is:

1. A process of designing a clock network of an ASIC to change clock delays, the clock network having a plurality of clock sources each having a clock domain, and the ASIC further includes data circuits that define timing paths between at least two clock domains, the process comprising steps of:
   a) selecting clock cells to be changed in the clock network;
   b) calculating a slack for each selected clock cell based on an insertion delay associated with at least one clock source and clock arrival and transition times required by the selected clock cell;
   c) adjusting cell delay based on the calculated slack
   d) identifying at least one group of clock domains having timing paths between member domains;
   e) equalizing clock insertion delays for all clock domains of the group; and
   f) altering clock insertion delays for clock domains in each group to minimize slack.

2. The process of claim 1, wherein the clock network is a clock tree having a plurality of levels, and step (a) comprises steps of:
   a1) calculating a slack to the cells of the clock tree based on a maximum delay between the at least one clock source and the leaves of the clock tree, an arrival time of a clock signal to each input of the respective cell and a transition time to transition the clock signal through the cell, and
   a2) selecting clock cells based on the tree level at which the cell is located and at least one of (i) the slack of the cell and (ii) an arrival window for all inputs of the cell.

3. The process of claim 2, wherein step (b) comprises recalculating the slack at each cell selected at step (a2).

4. The process of claim 1, wherein the clock network is a clock tree having a plurality of levels and wherein step (c) is performed by steps of:
   c1) defining a subtree of the clock tree,
   c2) for each cell in the subtree, defining maximum timing violations for all clock paths starting at the cell and for all clock paths ending at the cell,
   c3) establishing starting and ending path constraints based on the defined maximum timing violations, and
   c4) inserting clock buffers into the paths based on the starting and ending path constraints.

5. The process of claim 4, wherein step (c2) comprises, for each cell in subtree, steps of:
   c2a) identifying a maximum timing violation for all paths starting from the cell based on a worst case clock skew value of the paths from the cell, and
   c2b) identifying a maximum timing violation for all paths ending at the cell based on a worst case clock skew value of the paths to the cell.

6. The process of claim 4, wherein step (c3) comprises, for each cell in the subtree, steps of:
   c3a) calculating allowable upper and lower bounds for the skew value of the cell based on the clock period and the insertion delay of the clock source, and c3b) establishing starting and ending path constraints based on the maximum timing violations and the calculated upper and lower bounds.

7. The process of claim 4, wherein step (c4) comprises steps of:
   c4a) ordering the leaves of the clock tree to place cells having negative starting and ending path constraints at a selected position in the order, and
   c4b) inserting buffer cells between the clock source and the cells in the selected position.

8. The process of claim 1, wherein step (e) comprises adding a delay to the clock insertion delay of each clock domain of the group to equalize the insertion delay of all of the clock domains of the group.

9. The process of claim 8, wherein step (f) comprises reducing the clock insertion delay of each clock domain of the group to minimize negative slack for cells of the domain.

10. A process of designing a clock network of an ASIC to change clock delays, the clock network having a plurality of clock sources each having a clock domain, and the ASIC further includes data circuits that define timing paths between at least two clock domains, the process comprising steps of:
   a) balancing clock delays for cells within each clock domain;
   b) identifying at least one group of clock domains having timing paths between member domains;
   c) equalizing clock insertion delays for all clock domains of the group; and
   d) altering clock insertion delays for clock domains in each group to minimize slack.

11. The process of claim 10, wherein step (c) comprises adding a delay to the clock insertion delay of each clock domain of the group to equalize the insertion delay of all of the clock domains of the group.

12. The process of claim 11, wherein step (d) comprises reducing the clock insertion delay of each clock domain of the group to minimize negative slack for cells of the domain.

13. A storage medium having stored therein processor executable instructions that enable a processor to change clock delays in a clock network design for an ASIC having a plurality of clock sources, and the ASIC further includes data circuits that define timing paths between at least two clock domains, the processor executable instructions include:
   selection instructions that enable the processor to select clock cells to be changed in the clock network design;
   calculating instructions that enable the processor to calculate a slack for each selected clock cell based on an insertion delay associated with at least one clock source and clock arrival and transition times required by the selected clock cell;
   adjusting instructions that enable the processor to adjust cell delay based on the calculated slack;
   identifying instructions that enable the processor to identify at least one group of clock domains having timing paths between member domains;
   insertion instructions that enable the processor to equalize clock insertion delays for all clock domains of the group; and
   altering instructions that enable the processor to alter clock insertion delays for clock domains in each group to minimize slack.

14. The storage medium of claim 13, wherein the clock network is a clock tree having a plurality of levels, and the selection instructions include:
   instructions that enable the processor to calculate a slack to the cells of the clock tree based on a maximum delay between the at least one clock source and the leaves of the clock tree, an arrival time of a clock signal to each input of the respective cell and a transition time to transition the clock signal through the cell, and
   instructions that enable the processor to select clock cells based on the tree level at which the cell is located and at least one of (i) the slack of the cell and (ii) an arrival window for all inputs of the cell.

15. The storage medium of claim 13, wherein the adjusting instructions include:
   instructions that enable the processor to define a subtree of the clock tree,
   instructions that enable the processor to define maximum timing violations for all clock paths starting at each cell in the subtree and for all clock paths ending at each cell in the subtree,
   instructions that enable the processor to establish starting and ending path constraints based on the defined maximum timing violations, and
   instructions that enable the processor to insert clock buffers into the paths of the clock network design based on the starting and ending path constraints.

16. The storage medium of claim 13, wherein the insertion instructions comprises instructions that enable the processor to add a delay to the clock insertion delay of each clock domain of the group to equalize the insertion delay of all of the clock domains of the group.

* * * * *